United States Patent
Hathaway et al.

(10) Patent No.: US 6,826,733 B2
(45) Date of Patent: Nov. 30, 2004

(54) PARAMETER VARIATION TOLERANT METHOD FOR CIRCUIT DESIGN OPTIMIZATION

(75) Inventors: David J. Hathaway, Underhill Center, VT (US); Xiaoliang Bai, La Jolla, CA (US); Chandramouli Visweswariah, Croton-on-Hudson, NY (US); Philip N. Strenski, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 10/159,921

(22) Filed: May 30, 2002

(65) Prior Publication Data

US 2003/0226122 A1 Dec. 4, 2003

(51) Int. Cl.⁷ ............................................. G06F 17/50
(52) U.S. Cl. .................... 716/2; 703/2; 716/1; 716/5; 716/6
(58) Field of Search ............................ 716/2, 1, 18, 6, 716/5; 703/2

(56) References Cited

U.S. PATENT DOCUMENTS 6,324,678 B1 * 11/2001 Dangelo et al. .............. 716/18
6,327,552 B2 * 12/2001 Nemani et al. ................ 703/2

* cited by examiner

Primary Examiner—Thuan Do
(74) Attorney, Agent, or Firm—H. Daniel Schnurmann (57) ABSTRACT

A method for optimizing the design of a chip or system by decreasing the cost function that encompasses a plurality of constraints in the presence of variations in the design parameters is described. The method makes use of numerical optimization, simulated annealing, or any other objective-driven optimization means, and accounts for uncertainties in the modeling of the design variables and functions. A significant reduction in the number of design constraints which are violated at the end of an optimization process is achieved, even when all the design constraints cannot be satisfied. The optimization also reduces the cycle time at which the design operates and limits the increase in the minimum operational cycle time of a particular implementation in the presence of variations that cannot be modeled or unpredictable variations in delay introduced by elements of the design. The method for optimizing the design includes the steps of: defining an objective function computed from variables and functions of the design of the chip or system; deriving a merit function from the objective function by adding to it a plurality of separation terms; and minimizing the merit function which reduces the expected value of the objective function when confronted with significant variations of the design variables and functions.

20 Claims, 11 Drawing Sheets

PARAMETER VARIATION TOLERANT METHOD FOR CIRCUIT DESIGN OPTIMIZATION

FIELD OF THE INVENTION

The invention is related to the field of Electronic Design Automation, and more particularly, to a method of optimizing the design of an integrated circuit chip or system in the presence of uncertainty in the modeling or predictability of the design variables and functions, by reducing the number of design functions at limiting values in the final design.

BACKGROUND OF THE INVENTION

A wide variety of methods are employed in the optimization of integrated circuit designs. These techniques attempt to improve the design (i.e., to minimize some overall design cost or objective function) while meeting a set of constraints. Examples of design constraints include limits on the total silicon area occupied by the circuit, limits on the amount of power which can be consumed by the circuit, limits on the noise (i.e., unintended signals occurring on nets within the design due to such things as coupling from other wires) on any net in the design, and limits on the maximum path delay through the circuit (and hence on the maximum clock frequency and minimum clock period at which the circuit can operate). Each of these parameters may also contribute to the overall design objective function which is to be minimized. By way of example, a design objective may be to minimize (rather than to limit) the maximum path delay through the circuit, the area occupied by the circuit, the power consumed by the circuit, or some combination of these functions.

In many cases, the limits imposed by constraints are not absolute limits, but instead represent engineering judgment regarding the point beyond which the constrained function will unduly impact the correctness, reliability, performance, or other aspects of the design. Thus, these constraints are not hard, meaning that the design will fail if they are not met, and minor violations of the constraints may be acceptable. In many optimization methods, constraints are modeled as part of the objective function. In such instances, a constraint contributes nothing to the design objective if it is met, but violation of the constraint causes a large increase in the objective function, often proportional to the magnitude of the violation or to some power (e.g., the square) of the magnitude of the violation. Note that even a design objective which is to be maximized may be represented as part of an objective function to be minimized by suitable transformation, e.g., by including its negative (or for functions which are strictly greater than zero, its inverse) as part of the minimization objective. Where the ensuing description refers to minimizing an objective function it should be understood to include such transformations.

Many different methods can be used to optimize a design. Domain-specific heuristic search techniques can be used to propose a variety of small changes to a design which are expected, due to domain knowledge, to improve the objective function. One or more of these proposed change which gives the greatest reduction in the objective function is then chosen and implemented. This process is repeated until no further improvement is possible or until the processing time allowed for optimization has been exhausted.

Simulated annealing techniques optimize a system by a method analogous to process of annealing a physical material. Such methods propose a random change to a design, determine the increase or decrease in the objective function due to the change, accept all proposed changes which decrease the objective function, and only accept changes which increase the objective function according to a probability function related to the amount of increase in the objective function. This process is repeated many times, and a "temperature" parameter is slowly decreased during the optimization process, causing the probability of accepting objective function-degrading changes to decrease until, at the end, only objective function-improving changes are accepted. Further details about simulated annealing are described in U.S. Pat. No. 4,495,559 to Gelatt Jr. et al.

Numerical optimization techniques, as described, e.g., in the publication entitled "LANCELOT: A Fortran Package for Large-Scale Nonlinear Optimization" by A. R. Conn, et al., Springer-Verlag, 1992, use numerical methods to minimize an objective function represented as a function of a set of problem variables. Allowed ranges are defined for problem variables, and a set of constraints is given, each specifying that some linear or nonlinear function of some group of problem variables is less than zero (Note: any inequality constraint between functions of variables of a design can be converted to this form). The optimizer attempts to minimize the objective function subject to the imposed constraints by varying the problem variables within their allowed ranges. This type of optimization is often referred to as design tuning. Details of this technique may be found in an article entitled "Gradient-based optimization of custom circuits using a static-timing formulation" by A. R. Conn, et al., Proceedings of the 1999 IEEE/ACM Design Automation Conference. The inequality constraints are often converted to equality constraints by introducing constraint slack variables which are required to be greater than or equal to zero. For example, the following constraint (in which f and g are functions and x, y, z, u, v, and w are design variables):

$$f(x,y,z) \geq g(u,v,w,x)$$

can be converted to the following by the introduction of constraint slack variable s:

$$0 = s + f(x,y,z) - g(u,v,w,x),$$

$$s \geq 0$$

In many instances, the design objective function or some component thereof, will be the maximum of some set of functions of design variables. For example, if the objective is to minimize the longest path delay in a circuit, the value to be minimized will be the maximum of the path delay over all circuit paths, where each of these delays is a function of design variables such as transistor widths and wire widths. Optimization problems with objectives of this nature are often referred to as minimax problems, the variable to be minimized is the minimax variable, and constraints involving it are called minimax constraints. In a numerical optimization framework, assume that the set of design functions involved include f1, . . . , fn and the associated minimax variable representing the maximum of these values is z. The problem will then be to minimize z (or some monotonically increasing function of z) subject to constraints:

$$z \geq f1$$

$$z \geq fn$$

Similarly, a design objective function may include a variable to be maximized which is itself the minimum of some set of functions of design variables. Such a problem and variable are referred to as a maximin problem and variable, respectively, and can be transformed to a minimax problem and variable by negating the maximin variable and all functions constraining it. Hereinafter references to minimax problems and variables will be understood to include maximin problems and variables transformed in this manner.

There are multiple ways of modeling a design constraint or objective function involving the maximum (or minimum) delay through a circuit. One method is to identify every possible path through the integrated circuit and to constrain the delay of each identified path to be less than a limit. But the number of paths through a circuit can be very large, potentially growing exponentially with the size of the circuit, thus introducing an enormous number of constraints into the optimization problem.

Figure 1:
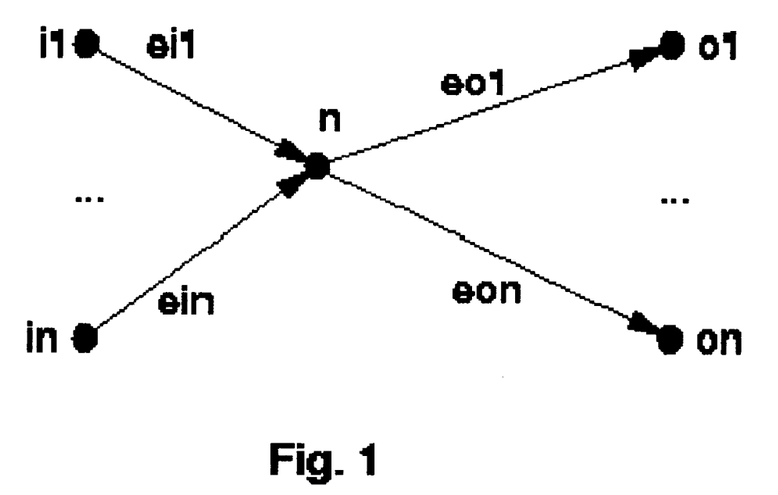
FIG. 1 is a diagram showing the vicinity of a node n in a timing graph.

An alternative method is to use a node-oriented static timing analysis algorithm as described, e.g., in U.S. Pat. No. 4,263,651 to Donath et al. Therein, a timing graph is created with nodes representing points in the network at which digital signal transitions (typically voltage transitions between ground and the supply voltage Vdd) occur and edges representing the dependencies between these nodes, so that an edge is present from node X to node Y if and only if, under some circumstances, a signal transition at X can directly cause a signal transition at Y. A late mode arrival time (AT) is computed at each node in the timing graph representing the latest time within the machine clock cycle at which a signal transition at the node can stabilize (reach the final value for the current machine cycle), and an early mode AT is computed at each node in the timing graph representing the earliest time within the machine clock cycle at which a signal transition at the node can become unstable (change from the value taken on at the end of the previous machine cycle). Nodes with no incoming edges are considered primary inputs (PIs) of the design and have fixed (not variable) ATs asserted by the designer. Optionally, required arrival times (RATs) can be computed at each node in the timing graph, with a late mode RAT representing the latest time that a signal transition can arrive at the node and still have its propagated consequences stabilize early enough at all network outputs to meet the design timing requirements, and an early mode RAT representing the earliest time that a signal transition can arrive at the node and still allow all network outputs to remain stable long enough to meet the design timing requirements. Nodes with no outgoing edges are considered primary outputs (POs) of the design and have fixed (not variable) RATs asserted by the designer. Consider a node n with incoming edges ei1, . . . , ein from nodes i1, . . . , in, respectively, with corresponding minimum delays di1min, . . . , dinmin, and maximum delays di1max, . . . , dinmax, and with outgoing edges eo1, . . . , eon to nodes o1, . . . , on, respectively, with corresponding minimum delays do1min, . . . , donmin, and maximum delays do1max, . . . , donmax. This is illustrated in FIG. 1. For node n, ATs are computed as:

$$ATlate(n)=\max(ATlate(i1)+di1\max, \ldots ATlate(in)+din\max)$$

$$ATearly(n)=\min(ATearly(i1)+di1\min, \ldots ATearly(in)+din\min)$$

and RATs are computed as:

$$RATlate(n)=\min(RATlate(o1)-do1\max, \ldots RATlate(on)-don\max)$$

$$RATearly(n)=\max(RATearly(o1)-do1\min, \ldots RATearly(on)-don\min)$$

In a numerical optimizer, these relationships can be represented as constraints. For example, the early and late mode ATs of n would be involved in the following constraints:

$$ATearly(n) \leq ATearly(i1)+di1\min$$

$$ATearly(n) \leq ATearly(in)+din\min$$

$$ATearly(o1) \leq ATearly(n)+do1\min$$

$$ATearly(on) \leq ATearly(n)+don\min$$

$$ATlate(n) \geq ATlate(i1)+di1\max$$

$$ATlate(n) \geq ATlate(in)+din\max$$

$$ATlate(o1) \geq ATlate(n)+do1\max$$

$$ATlate(on) \geq ATlate(n)+don\max$$

Early and late mode timing slacks (not to be confused with constraint slacks in numerical optimization) can be defined at a node as follows, so that a negative slack always indicates the violation of a timing requirement:

$$\text{Slack\_late}(n)=RATlate(n)-ATlate(n)$$

$$\text{Slack\_early}(n)=ATearly(n)-RATearly(n)$$

Numerical optimizers operate most efficiently if the number of constraints and variables in the problem is minimized. When representing a late mode timing problem as a set of constraints, it is often possible to reduce both the number of variables and constraints by eliminating ATlate constraints. This process is called pruning, which is described in detail in U.S. Pat. No. 6,321,362 to Conn et al.

By way of example, consider a timing graph in which an edge exy from node X to node Y with delay dxy is the only incoming edge of node Y and an edge eyz from node Y to node Z with delay dyz is the only outgoing edge of node Y. Then the ATlate(Y) variable can be eliminated and constraints:

$$ATlate(Y) \geq ATlate(X)+dxy$$

$$ATlate(Z) \geq ATlate(Y)+dyz$$

can be replaced by the single constraint $$ATlate(Z) \geq ATlate(X)+dxy+dyz$$

Figure 2:
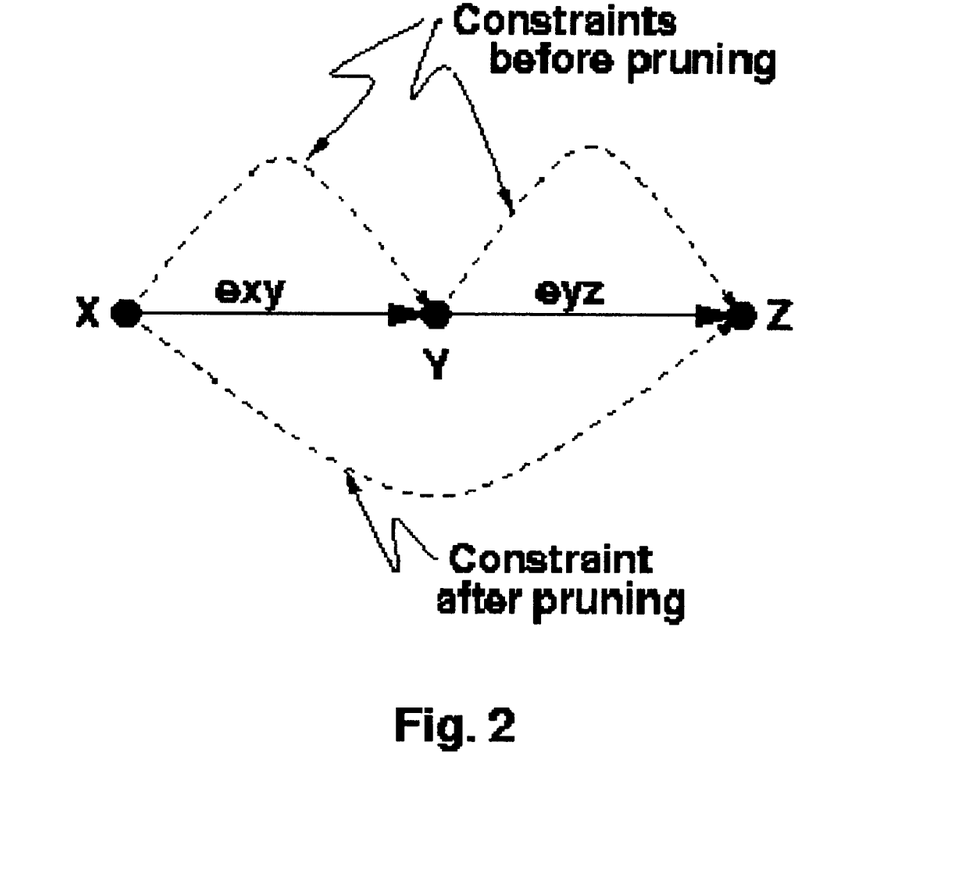
FIG. 2 is a diagram showing the pruning of node n in a timing graph.

This is illustrated in FIG. 2.

In many instances, an optimization objective is to minimize the cycle time of the design. If the late mode timing slacks at all POs are positive, the nominal cycle time of the machine, T0 (relative to which the PO RAT values were specified), can be reduced by the minimum of these positive slack values. Thus, if the set of POs of the design is PO1, . . . POn and the cycle time to be minimized is T, this implies the following minimax constraints:

$$RATlate(PO1) \geq ATlate(PO1)+T0-T$$

$$RATlate(POn) \geq ATlate(POn)+T0-T$$

It is possible, and often advantageous, to prune ATlate variables for POs, just as for other nodes in the timing graph. For example, if PO node S has incoming edges from nodes Q and R with delays dqs and dqr, respectively, constraints:

$$ATlate(S) \geq ATlate(Q)+dqs$$

$$ATlate(S) \geq ATlate(R)+drs$$

$$RATlate(S) \geq ATlate(S)+T0-T$$

can be replaced by constraints $$RAT\text{late}(S) \geq AT\text{late}(Q) + dqs + T0 - T$$

$$RAT\text{late}(S) \geq AT\text{late}(R) + drs + T0 - T$$

In a numerical optimizer, it can occur that a variable is not at one of its limits and has no constraint which directly limits its value. For example, if a circuit contains nodes X, Y, and Z with delay edges from X to Y and from Y to Z, the delay from X to Y and from Y to Z each have maximum values of 1, ATlate(X)=0, and ATlate(Z)=3 (due to some other incoming edge to Z, then variable ATlate(Y) can take on any value from 1 to 2 without affecting the optimization result. This situation is called "degeneracy" of the variable, and can cause undesirable behavior in a numerical optimizer. Degeneracy of design constraints can also occur when a constraint is tight (i.e., the constraint slack is zero) but does not directly affect the objective function (i.e., the constraint slack can be increased without increasing the objective function), because no "chain" of other tight constraints exists to "transmit" changes in the constraint slack to the objective function. Thus, it is advantageous to reduce the degeneracy in problems posed to numerical optimizer.

It is possible that a design optimization method fails to reduce the design objective function to an acceptable value. For example, if the design objective function is (or includes) the achievable cycle time of the design, the optimization process may end with a cycle time which is larger than desired. Typically, in such cases a designer will apply other manual methods which are unknown to or were not considered by the optimizer to further improve the design objective function. It is therefore desirable that the portion of the design which needs to be improved (e.g., the number of POs whose AT values do not satisfy the desired cycle time) be as small as possible, to reduce the manual effort required by the designer.

Figure 3:
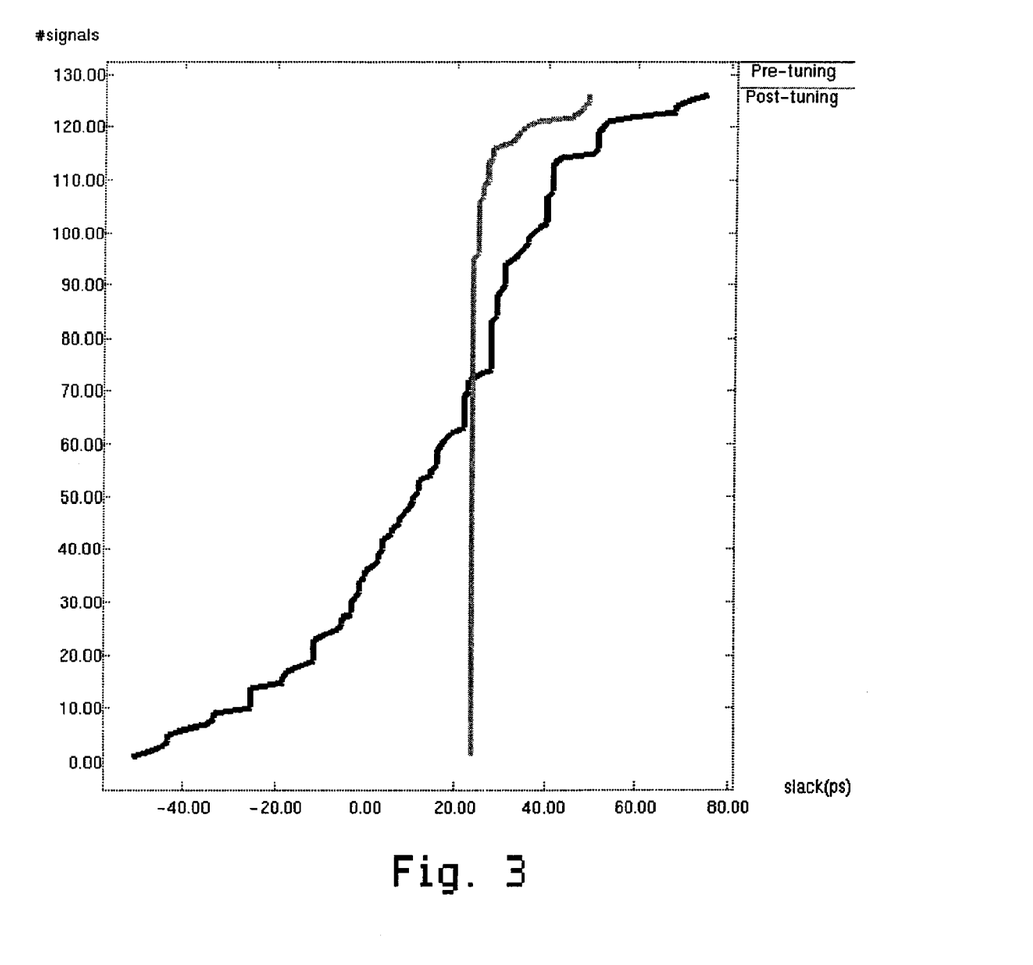
FIG. 3 is a timing slack histogram of a design before and after optimization using prior art methods.

Often an optimizer will have both upward and downward pressure on a design function or variable. For example, the delay of an edge in a timing graph may be inversely related to the size of one or more transistors in the circuit, and the sum of the size of all the transistors in the design may be constrained not to exceed a value or it may be a component of the overall objective function. The optimizer will then attempt to reduce the size of the transistors, thereby increasing delays as long as it does not violate another constraint or impact the objective function. Assuming that the optimization objective is to minimize the cycle time T, and some critical path in the design causes a lower limit on T of Tmin (i.e., the slack along this path cannot be increased above T0−Tmin). If the ATlate constraints are formulated as above, the incentive to increase delays combined with the ATlate constraints will cause, for primary output pj, ATlate(pj) to increase until it equals RATlate(pj)−T0+Tmin, and the constraint slack of the minimax constraint in which it is involved is zero. The optimizer will have an incentive to reduce these ATlate variables (and hence T) only if all of them can be reduced together and, thus, all PO late mode ATs will increase to equal the one that is hardest to reduce. This is achieved by paying large costs (e.g., making large increases in transistor widths) along the critical path(s), appropriating this cost from non-critical paths (e.g., reducing transistor widths, thereby increasing delays along non-critical paths in order to obey a constraint on the sum of all transistor widths). As a result very large delay increases may occur along non-critical paths in order to achieve minuscule delay decreases along the critical path(s). The result of such an optimization is shown in FIG. 3. The horizontal axis represents the late mode timing slack, and the vertical axis represents the cumulative number of POs whose timing slack is less than the horizontal axis slack. It can be seen that the optimization process has created a "slack wall," where most POs have been tuned to a slack of about 24 (those with higher slacks had other constraints which limited the increase in the delays of the paths feeding them).

Unfortunately, the basis upon which the design is optimized has its limitations. Static timing and other analysis methods make a number of simplifying assumptions. The prediction of parasitic electrical parameters upon which delay and other aspects of circuit behavior depend may be less than perfect. Model-to-hardware correlation problems often arise. The design may undergo further modification after the optimization program has completed. Unpredictable variations may cause circuit parameters to change from their nominal values. Variations can be due to manufacturing process or environmental variations (e.g., supply voltage or temperature). If the modeling of the problem in the optimizer is not exact, or the modeled parameters are not exactly predictable, the actual values which a design parameter will take in any given manufactured instance of the design may best be considered as a random variable whose value is described by probability distribution function (PDF) rather than a specific value. For example, a PO late mode AT which is modeled as having value 10 may in reality take on a range of values from 8 to 12 in different manufactured instances and different operating conditions.

In the face of all this uncertainty, having a slack wall of equally timing critical POs is undesirable, since simple statistical principles predict that when each value in the slack wall is a random variable, the expected maximum of these values is larger when the height of the wall is greater. In a paper titled "Increase in Delay Uncertainty by Performance Optimization" published in the Proceedings of the 2001 International Symposium on Circuits and Systems, M. Hashimoto et al. show that it is possible for careful optimization of a circuit to actually degrade the performance due to manufacturing variations, and demonstrate the impact of the height of the slack wall.

One method for handling this problem is to attempt to more accurately model the values and distributions of design parameters. This requires that the entire optimization process deal with design parameters as random variables rather than as scalar values. It is not clear how to apply existing techniques to such a model, and where it is possible, it would drastically increase the complexity and runtime of the optimization process. For example, the simple act of taking the maximum of two random variables requires a convolution (a double-integration process) to compute the resulting PDF.

In view of the foregoing, there is a need for a method to improve the expected value for the objective function of a design by reducing the number of design constraints which will be at limiting values in the final design without explicitly modeling the variation in design parameters.

OBJECTS OF THE INVENTION

Thus, it is an object of the invention to provide a method for reducing the number of design constraints which will be at the limiting values of the final design in the presence of uncertainty in the modeling of design parameters.

It is another object to provide a method for decreasing the expected cost of a design whose objective function includes a plurality of minimax constraints in the presence of uncertainty in the modeling of design parameters.

It is still another object to provide a method for decreasing the expected cost of a design by way of numerical optimization in the presence of uncertainty in the modeling of design parameters.

It is yet another object to provide a method for reducing the degeneracy of design numerical optimization problems.

It is a further object to provide a method for reducing the number of design constraints which are violated at the end of the optimization process, in the event that all design constraints cannot be satisfied.

It is a more particular object to reduce the cycle time at which a design can operate in the presence of uncertainty in the modeling of design parameters.

It is still a further object to reduce the increase in the minimum operational cycle time of a particular implementation of the design in the presence of variations that cannot be modeled or unpredictable variations in any of the delays of the elements of the design.

SUMMARY OF THE INVENTION

In one aspect of the invention, there is described a method for optimizing or tuning high performance digital circuits or electronic systems. Existing optimization techniques provide a plurality of paths deemed to be equally critical. These optimization methods are often unable to account for manufacturing and environmental variations. To these variations are to be added inaccurate modeling, all of which introduce a degree of uncertainty that adversely affects the expected performance of the circuit or system. Further, the large number of critical paths being singled out makes the process of further manual optimization of the circuit or system and cumbersome.

The present invention modifies the way of tuning the circuits or system by sensitizing the design to account for the aforementioned uncertainty. At a cost of a negligible price in the nominal system performance, the number of equally critical paths is reduced substantially and a separation is achieved between the most critical paths and the remaining paths. Thus, the resulting design is less sensitive and less likely to be affected by manufacturing variations and the like, making the downstream restructuring of the circuit or system much easier.

In another aspect of the invention, an extra penalty is added to the objective function for each primary output of the design, such that increasing the separation between the slack of the primary output and the worst slack, curtails the size of the penalty. This penalty forces the optimizer to obtain the necessary separation and facilitate the optimization process.

The present invention provides a method for optimizing the design of a chip or system that includes the steps of: defining an objective function computed from variables of the design of the chip or system; deriving a merit function from the objective function by adding to the objective function a plurality of separation terms; and minimizing the merit function which reduces the expected value of the objective function in the presence of variations of the design variables.

The invention further provides a method for optimizing the design of a chip or system by minimizing the expected cycle time at which the chip or system can operate, the method comprising the steps of: defining an objective function as the nominal value of the minimum cycle time at which the chip or system can operate computed as a function of the design parameters of the design; deriving a merit function from the objective function by adding to the objective function a plurality of separation terms, each of the separation terms being a function of the difference between two quantities associated with a node or edge of a timing graph of the design; and minimizing the merit function which reduces the expected value of the objective function in the presence of variations of the design parameters.

BRIEF DESCRIPTION OF THE DRAWINGS

These and other objects, aspects and advantages of the invention will become apparent from the detailed description of the invention when taken in conjunction with the accompanying drawings, in which.

DETAILED DESCRIPTION OF THE INVENTION

Generally, in the present invention, a penalty is added to the cost function used by the optimization method to give the optimizer an incentive to reduce the number of constraints which are at their limiting value. In the case of a delay minimization problem this means that the optimizer has an incentive to avoid a tall wall in the timing slack histogram. The chosen form of the penalty has several good properties that are crucial to implementing a working solution. The resulting circuits have more appealing slack histograms, while paying a negligible price for the better slack distribution. In the face of uncertainty, the circuit with the better slack distribution offers both better performance and better insensitivity to variations. After optimization, if the required slack is still not met, restructuring is much easier when the number of equally critical paths is manageable. The inherent degeneracy in the problem formulation is also reduced, causing a numerical optimizer to be more effective.

Figure 4:
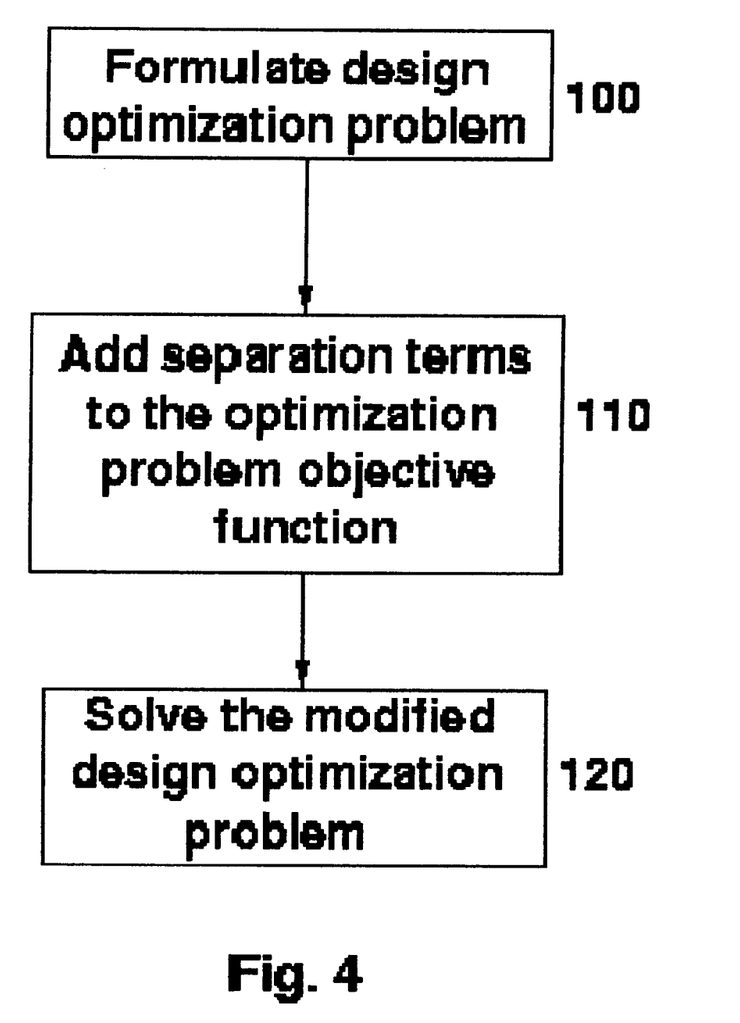
FIG. 4 is a flowchart detailing the steps of the present invention.

Referring to FIG. 4, a flowchart illustrates the steps of the inventive method. In step 100, the design optimization problem, including the objective function to be minimized, is formulated. The problem formulation includes a plurality of constraints which require some functions of the variables of the design to be less than zero. The constrained function may simply be a design variable which is explicitly specified in the design implementation, such as a transistor width. It may be a design variable which is used by the optimizer to manage and structure the optimization problem. Alternatively, it may be a function which can be computed from such variables, such as a delay. The specific nature of a particular design function being constrained may depend on the method of operation of the optimizer. For example, an AT value may be either explicitly computed function (e.g., as the maximum of a set of computed values) or, in a numerical optimizer, it may simply be a variable used by the optimizer to manage the problem.

In step 110, a number of separation terms are added to the objective function being minimized to create a merit function. A separation term may be added for each of a plurality of the constraints generated as part of the problem formulation in step 100. Other separation terms may also be added which are not directly related to a specific constraint. These separation terms collectively include a penalty which increases as the number of tight constraints for which separation terms were generated increases. If the optimization method includes explicit constraints slack variables, separation terms can be functions of these constraint slack variables. Even if such constraint slack variables are not normally used in the optimization method, they can be computed and separation terms can be functions of these computed constraint slacks.

In step 120, the problem is solved by minimizing the merit function. As a result of the separation terms added in step 110, the resulting problem solution will have fewer functions at their limiting values than would be the case in the absence of these terms.

Each separation term is a decreasing function of the constraint slack of the constraint with which it is associated. This constraint slack is also referred to as the separation of the constraint, since it is the numerical separation between the constrained function and its constraint. Preferably the function used to compute the separation term is at a maximum when the separation is zero, and decreases rapidly to zero for large separation values. A function which has this desired characteristic is $$P(s)=Ke^{-s/\Phi}$$

where P is the separation term which is part of the penalty function, s is the constraint slack or separation, and K and $\Phi$ are positive constants. This function takes on a maximum value of K at zero separation decays to K/e for s=$\Phi$, and from there rapidly to zero for larger separations. The value of $\Phi$ should be chosen according to the expected variability of the constrained functions. A larger value of $\Phi$ should also be selected for larger parameter variability. If different functions have different expected variability, different values for $\Phi$ may be used for different separation terms.

In each constraint for which a separation term is added, the purpose is to increase as much as possible the margin by which the constraint is satisfied, by introducing downward pressure on the constrained function. Normally, these include minimax constraints, and as a result the added penalty results in an upward pressure on the associated minimax variable. Thus, the parameters of the penalty function must be chosen in such a way as to make sure that there is overall downward pressure on the minimax variable. In other words, the optimizer should not artificially increase the minimax variable to be higher than necessary just to obtain a reduction in the separation penalty terms. This situation is referred to as "lift-off" of the minimax variable. The K value should be chosen to avoid lift-off, according to the number of separation terms introduced. A conservative way of ensuring this is to set $$K \leq \Phi/N$$

where N is the maximum number of minimax constraints associated with any minimax variable. Although it is preferable to avoid lift-off, it is generally not deemed to be harmful since as soon as the minimax variable artificially increases, the separation term for the most critical constraint (the one with the smallest constraint slack) becomes smaller than K, and all the other separation terms also decrease, so the gradient of the penalty function with respect to the minimax variable quickly increases from an initial negative value until it becomes zero, and the minimax variable will not increase further. So the final value of the minimax variable is larger than necessary, but this does not increase the final value of any of the functions constrained by it, as long as separation terms are included for each of them.

Figure 5:
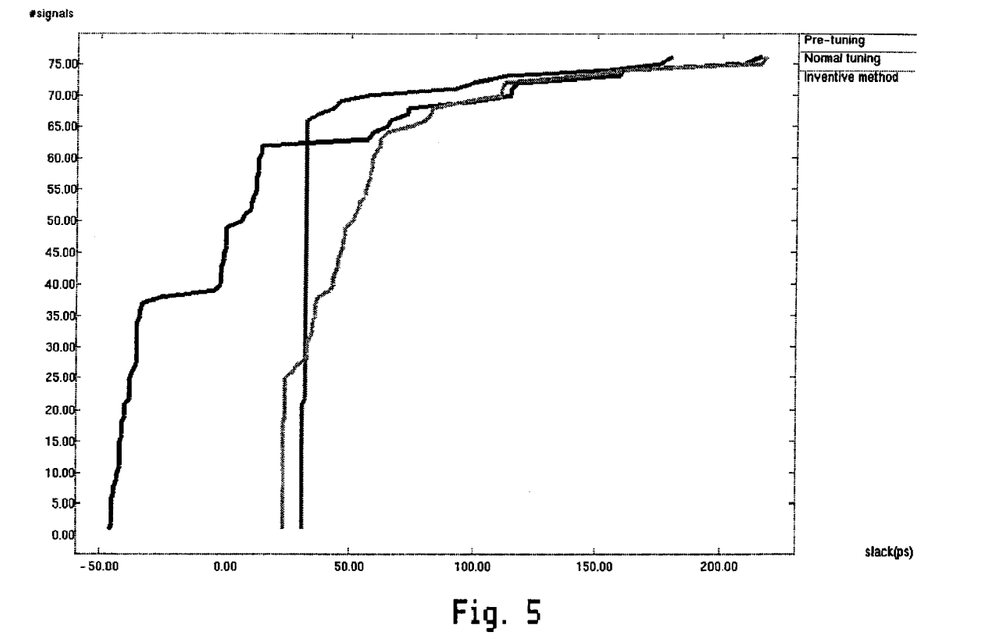
FIG. 5 is a timing slack histogram of a design a) before optimization, b) after optimization using prior art methods, and c) after optimization in accordance with the method of the present invention.
Figure 6:
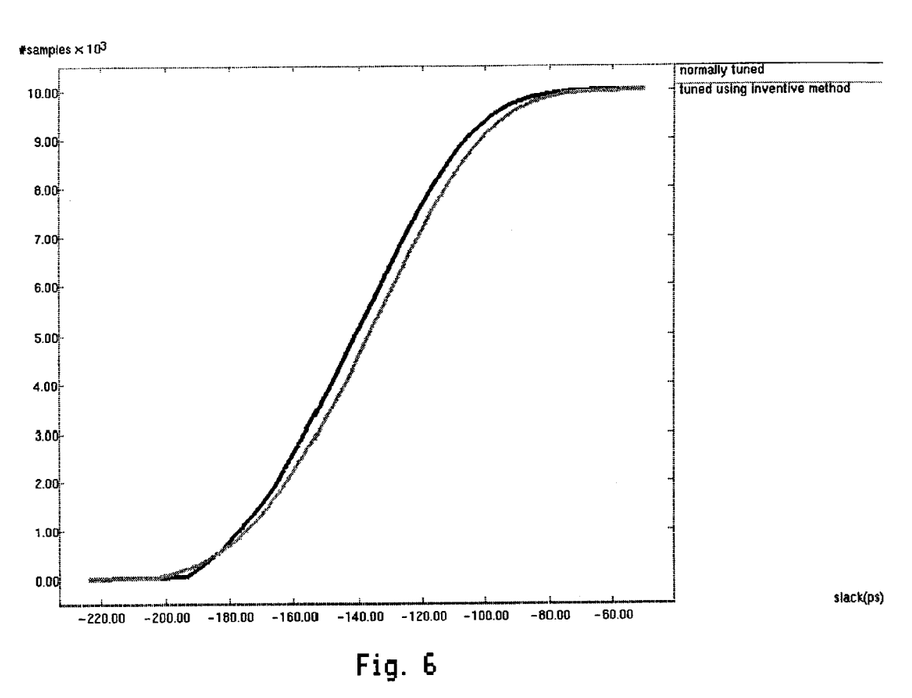
FIG. 6 is a cumulative probability histogram showing distribution of late mode timing slacks of manufactured samples of a design optimized using prior art methods and optimized using the method of the present invention.

FIG. 5 shows an example of the effect of the introduction of the penalty function on the optimization result for a cycle time minimization problem. As in FIG. 3, the horizontal axis represents the late mode timing slack and the vertical axis represents the cumulative number of primary outputs whose timing slack is less than that slack. The three lines are the histograms of the minimum timing slack of about −45, the normally tuned design showing a minimum timing slack of around 33, and the design tuned using the method of the invention with a slack of around 25. The minimum nominal timing of the designed tuned by the inventive method is lower than that for the normally tuned design, indicating that the amount by which the nominal cycle time can be reduced is less in the absence of delay variation. However, in the presence of delay variation the expected minimum slack for any specific manufactured implementation of the design will be greater for the design tuned using the inventive method. This is shown in FIG. 6, in which the x axis is the expected timing slack of the design and the y axis is the number of design instances out of 10,000 which would be expected to have that slack or less and, therefore, would be unable to operate at cycle times shorter than that associated with the corresponding slack value. Since the curve for the uncertainty-aware design tuned using the inventive method is below the curve for the normally tuned design, this implies that the number of instances of the uncertainty-aware design which would be unable to operate below any given cycle time will be smaller than the corresponding number for the normally tuned design, or equivalently, that the number of uncertainty-aware design instances able to operate at any given cycle time will be greater. For a given performance requirement, a circuit or system tuned by the inventive method has a better parametric yield, and for a given yield it has better performance than a circuit or system tuned by the prior art method. Thus it can be seen that a circuit or system tuned for optimal performance at nominal values of design variables may no longer be optimal in the presence of variation.

Figure 7:
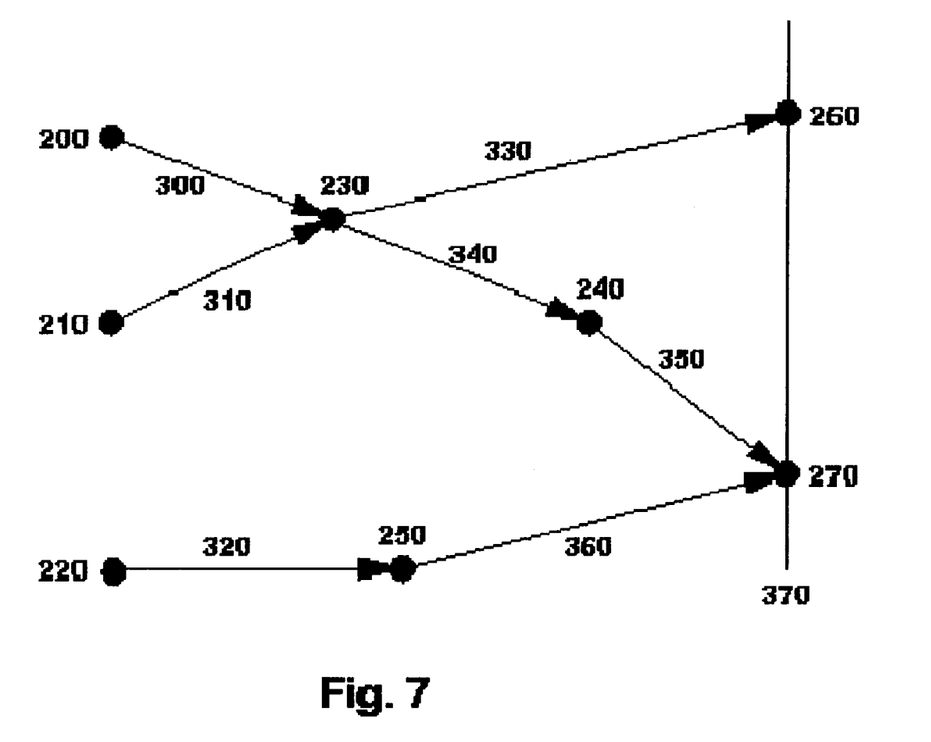
FIG. 7 is a timing graph to which the inventive method is applied.

Referring now to FIG. 7, a timing graph showing a particular application of the invention to cycle time minimization using a numerical optimization will now be described. Nodes 200, 210, and 220 are ATlate values at the PIs of the design. These are constants specified by the designer. Nodes 230, 240, and 250 are internal ATlate variables which are part of the optimization problem. Nodes 260 and 270 are ATlate timing graph variables at primary outputs of the design. Lines 300 through 360 are delay edges in the timing graph which represent the maximum time required for a transition at the edge source to cause a transition at the edge sink. Line 370 represents the cycle time T of the design which is to be minimized. For simplicity in this example all PO RATs are equal (at T) but, generally, RAT for each PO could be at a different constant offset from T. Schematically, time increases in the diagram from left to right, and all primary output (PO) nodes are constrained to be less than or equal to T, so shortening delay edges allows line 370 to move to the left, thereby reducing the cycle time of the design. The numerical optimization constraints generated for the timing graph of FIG. 7 are listed below. Variables s1 through s9 are constraint slack variables, AT(x) is the late mode AT of node x, d(y) is the delay of edge y, RAT(z) is the late mode RAT of PO z, T0 is the nominal cycle time of the design (with respect to which the RAT values were defined), and T is the achieved cycle time of the design which is being minimized subject to these constraints:

$$0=s1+AT(200)+d(300)-AT(230)$$

$$0=s2+AT(210)+d(310)-AT(230)$$

$$0=s3+AT(230)+d(330)-AT(260)$$

$$0=s4+AT(230)+d(340)-AT(240)$$

$$0=s5+AT(240)+d(350)-AT(270)$$

$$0=s6+AT(220)+d(320)-AT(250)$$

$$0=s7+AT(250)+d(360)-AT(270)$$

$$0=s8+AT(260)-RAT(260)+T0-T$$

$$0=s9+AT(270)-RAT(270)+T0-T$$

The last two of these are minimax constraints involving T, the cycle time to be minimized. In a first embodiment of the invention the penalty added to the cost function of the optimization problem comprises a separation term for each primary output of the design. Thus, in the example of FIG. 7, the penalty is:

$$P\text{total}=P(s8)+P(s9)$$

Figure 8:
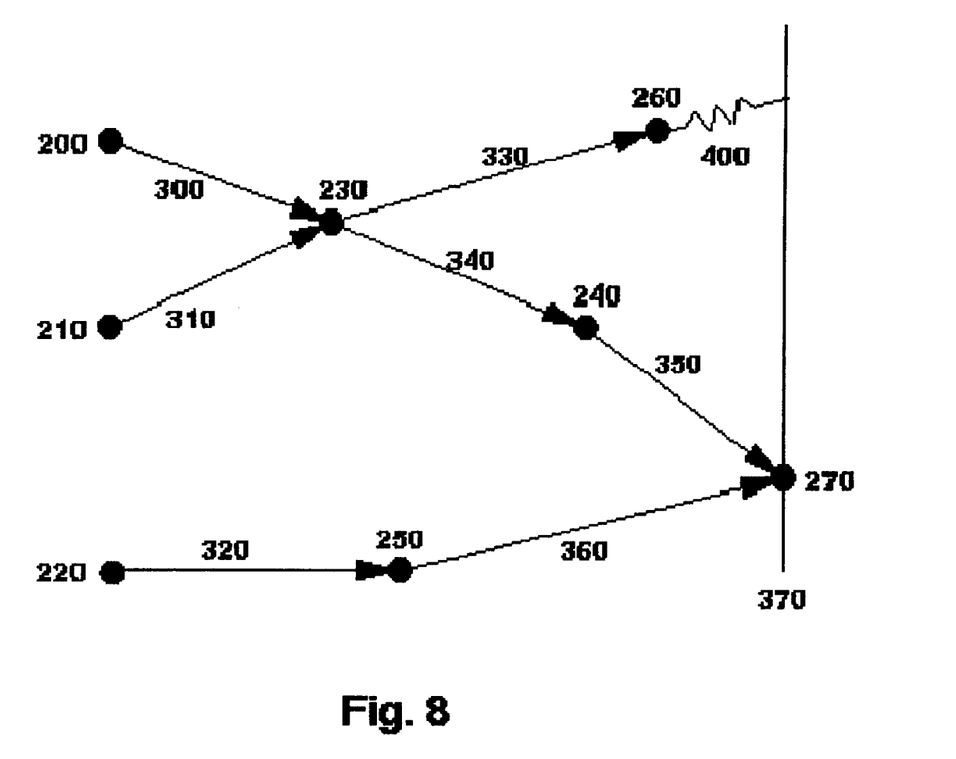
FIG. 8 is a diagram showing the introduction of a separation term for each primary output of the design.

This is shown schematically in FIG. 8, which is the timing graph of FIG. 7 with separation terms and constraint slacks shown. Zig-zag line 400 represents the separation term associated with primary output 260. Another separation term is associated with primary output 270, but the constraint slack for the minimax constraint for 270 is zero and the separation term is not shown. Similarly constraint slacks associated with delays 300, 310, 320, 330, 340, 350, and 360 are zero and are not shown.

In the preceding embodiment AT variables must be retained (not pruned) for each primary output. This may result in more optimization constraints and variables than would otherwise be required. This embodiment also does not provide incentive to reduce all delays. In the example in FIG. 8, the constraint slacks are all zero along the path through nodes and edges 200, 300, 230, 340, 240, 350, 270, along the path through 210, 310, 230, 340, 240, 350, 270, and along the path through nodes and edges 220, 320, 250, 360, and 270. Therefore, if any unpredictable increase or ant that cannot be modeled occurs in any of delays 300, 310, 340, 350, 320, or 360, or in PI values AT(200) or AT(210), the minimum cycle time at which the design will operate will increase beyond that expected by the optimizer. In the absence of lift-off, at least one PI to PO path, referred to as the critical path of the design, will have all zero constraint slacks. However, it is advantageous to create an incentive for the optimization method to create positive constraint slacks on at least one constraint in every other path, to reduce the number of delays whose unmodeled or unpredictable increase would degrade the performance of the design.

In a second embodiment, pruning of POs is allowed, and a separation term is introduced for each minimax constraint. If the two primary output variables in the timing graph of FIG. 7 are pruned, these constraints:

$$0=s3+AT(230)+d(330)-AT(260)$$

$$0=s5+AT(240)+d(350)-AT(270)$$

$$0=s7+AT(250)+d(360)-AT(270)$$

$$0=s8+AT(260)-RAT(260)+T0-T$$

$$0=s9+AT(270)-RAT(270)+T0-T$$

are replaced by the following:

$$0=s10+AT(230)+d(330)-RAT(260)+T0-T$$

$$0=s11+AT(240)+d(350)-RAT(270)+T0-T$$

$$0=s12+AT(250)+d(360)-RAT(270)+T0-T$$

and the total penalty is:

$$P\text{total}=P(s10)+P(s11)+P(s12)$$

Figure 9:
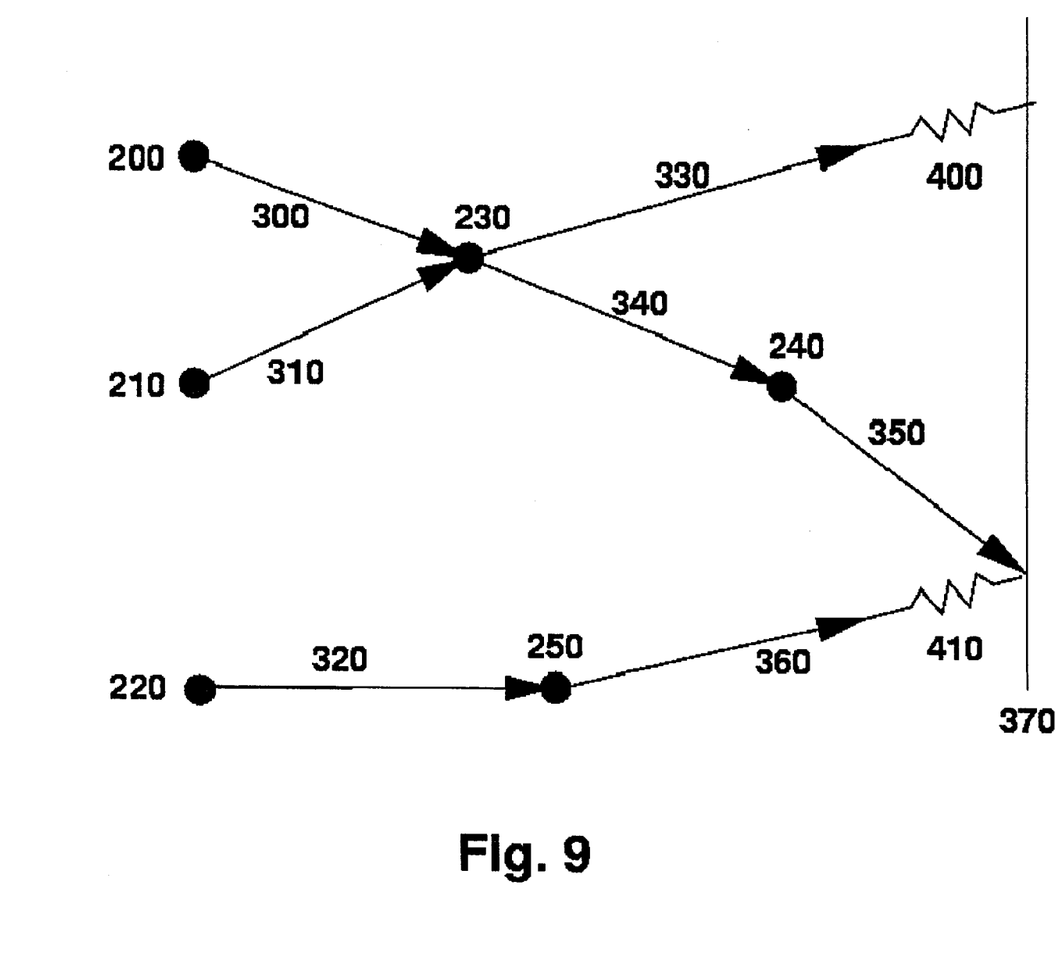
FIG. 9 is a diagram showing the introduction of a separation term for each minimax constraint in the design.

Its effect is shown in FIG. 9. Herein, AT variables 260 and 270 have been removed through pruning. Other pruning could have been performed but has not in order to simplify the example. Added separation term 410 is associated with the constraint involving node 250 and edge 360. Another separation term is associated with the constraint involving node 240 and edge 350, but the constraint slack for this minimax constraint is zero and the separation term is not shown. The effect of this change is that only along path 200, 300, 230, 340, 240, 350, 370 and along the path through 210, 310, 230, 340, 240, 350, 370 will small unmodeled or unpredictable increases in delay degrade the performance of the design.

The preceding embodiments improve the probability that design performance will not be degraded by small unmodeled or unpredictable increases in delays within the design. However, they do not provide incentives to reduce all possible delays not in the critical path of the design. For example, no incentive was provided to cause the constraint slacks associated with delays 300 and 310 to be non-zero. Thus, the tuned design has two critical paths: 200, 300, 230, 340, 240, 350, 370 and 210, 310, 230, 340, 240, 350, 370. If either delay 300 or 310 has an unmodeled or unpredictable increase the performance of the design will be degraded. A set of separation terms can be generated which create an incentive for the timing slack on all nodes in the design to be positive, thus reducing further the sensitivity of the optimized design to unmodeled or unpredictable increases in delay. One way to achieve this is to introduce separation terms for all AT constraints in the design. A disadvantage of this approach is that there are now multiple separation terms along a path, which can result in a greater separation pressure than is desired. Using this method, the example of FIG. 9 would include separation terms for the constraint slacks associated with all delay edges in the design, so that the path 200, 300, 230, 340, 240, 350, 370 would include three separation terms, one for each of the delays in the path.

However one separation on any path is all that is needed to avoid undesirable sensitivity of the design performance to delay variation. Another disadvantage of this method is that the AT variables may no longer reflect the correct static timing analysis result, since any separation in the fan-in cone of a node may result in the AT of that node being artificially large.

An alternative method avoids these disadvantages while still providing incentives to reduce arrival times at all nodes in the design. A parallel set of constraints and variables is created which models the required arrival times in the timing graph. A parallel RAT node is created for every AT node in the timing graph, and parallel delay edges and constraints are generated to relate these. A separation term is then added between every AT and its corresponding RAT. The separation values here are the timing slacks of the nodes rather than constraint slacks, and since a separation term is added for every node in the timing graph, an incentive is created to make each node's timing slack positive. The RAT constraints are adjusted so that they are relative to the achievable cycle time (the T variable being minimized by the optimizer). In this case the PI RATs, if included, are variables rather than user asserted values. Since the PI ATs cannot be reduced, the corresponding RATs and separation terms may be omitted. Another advantage of this method is that since every AT variable has a separate downward pressure and each of the added RAT variables has a separate upward pressure, all degeneracy in the AT and RAT variables has been removed, although degeneracy may still exist in the constraints because of choice in the way in which delays are apportioned along paths. For the example of FIG. 8, the added constraints are:

$$0 = s13 + RAT(230) + d(330) - RAT(260) + T0 - T$$

$$0 = s14 + RAT(230) + d(340) - RAT(240)$$

$$0 = s15 + RAT(240) + d(350) - RAT(270) + T0 - T$$

$$0 = s16 + RAT(250) + d(360) - RAT(270) + T0 - T$$

and the penalty function is:

$$Ptotal = P(RAT(260) + T0 - T - AT(260)) +$$
$$P(RAT(270) + T0 - T - AT(270)) +$$
$$P(RAT(230) - AT(230)) +$$
$$P(RAT(240) - AT(240)) +$$
$$P(RAT(250) - AT(250))$$

Figure 10:
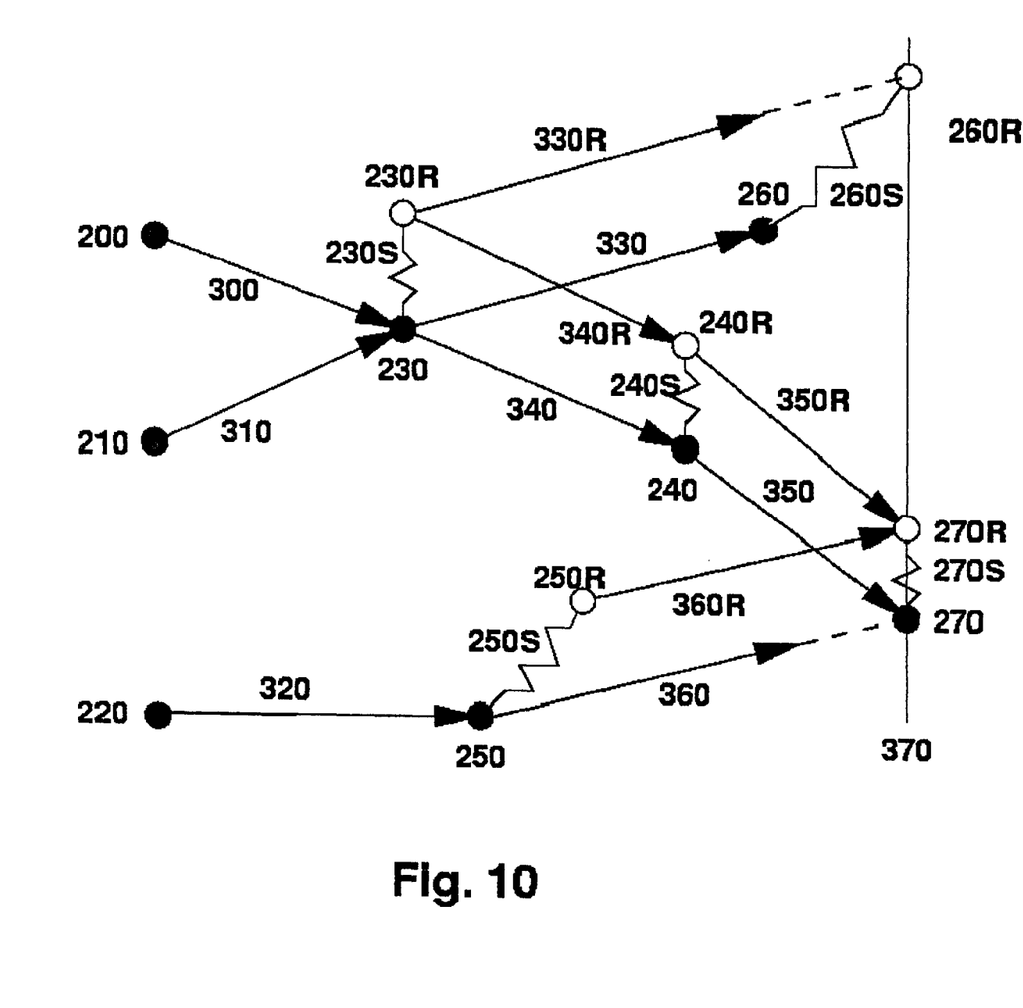
FIG. 10 is a diagram showing the introduction of a separation term for each node in the timing graph of the design.

This is shown schematically in FIG. 10. Herein, 230R, 240R, 250R, 260R, and 270R are the added RAT variables. Edges 330R, 340R, 350R, and 360R depict the delays between the RAT variables. Note that these are not independent delay values but are instead the same as the delays between the corresponding AT variables. Thus, d(330)=d(330R), d(340)=d(340R), d(350)=d(350R), and d(360)=d(360R). Although the delay values are the same, the differences between the RAT and AT variables at their endpoints may be different. This means that the constraint slacks of the constraints associated with some of these delays will be positive, and these positive constraint slacks are represented in FIG. 10 by the dashed portions of lines 360 and 330R. The separation terms are represented by zig-zag lines 230S, 240S, 250S, 260S, and 270S. Although some of these are drawn vertically, the pressure applied always pushes ATs to the left (to a smaller value) and RATs to the right (to a larger value). Since all separation terms are in parallel, all AT and RAT variables will reflect the correct static timing analysis result at their optimum value.

The preceding method eliminates all the degeneracies from the problem and provides an incentive to make all node slacks positive, but it still does not provide an incentive to make all constraint slacks positive. In the example of FIG. 10, the constraint slacks associated with both delay 300 and delay 310 are zero, since if one of them is in the critical path and therefore must have a zero constraint slack, there is no incentive to the optimizer to make the other constraint slack positive, and thus the design will be sensitive to unmodeled or unpredictable increases in delay. An incentive can be provided to make all constraint slacks positive and therefore to reduce the delays of all edges which are not in the critical path by generating the RAT variables and constraints as above, but then using them to create a separation term for every delay edge, or more generally in the case of pruning, for every AT constraint. Each separation term will relate the AT at the source of a constraint with the RAT at the sink of the corresponding RAT constraint. Again, the RATs associated with POs are adjusted so that they are relative to the achievable cycle time (the T variable being minimized by the optimizer). For the example of FIG. 10 the total penalty function Ptotal is:

$$Ptotal = P(RAT(230) - AT(200) - d(300)) +$$
$$P(RAT(230) - AT(210) - d(310)) +$$
$$P(RAT(260) + T0 - T - AT(230) - d(330)) +$$
$$P(RAT(240) - AT(230) - d(340)) +$$
$$P(RAT(270) + T0 - T - AT(240) - d(350)) +$$
$$P(RAT(250) - AT(220) - d(320)) +$$
$$P(RAT(270) + T0 - T - AT(250) - d(360))$$

Figure 11:
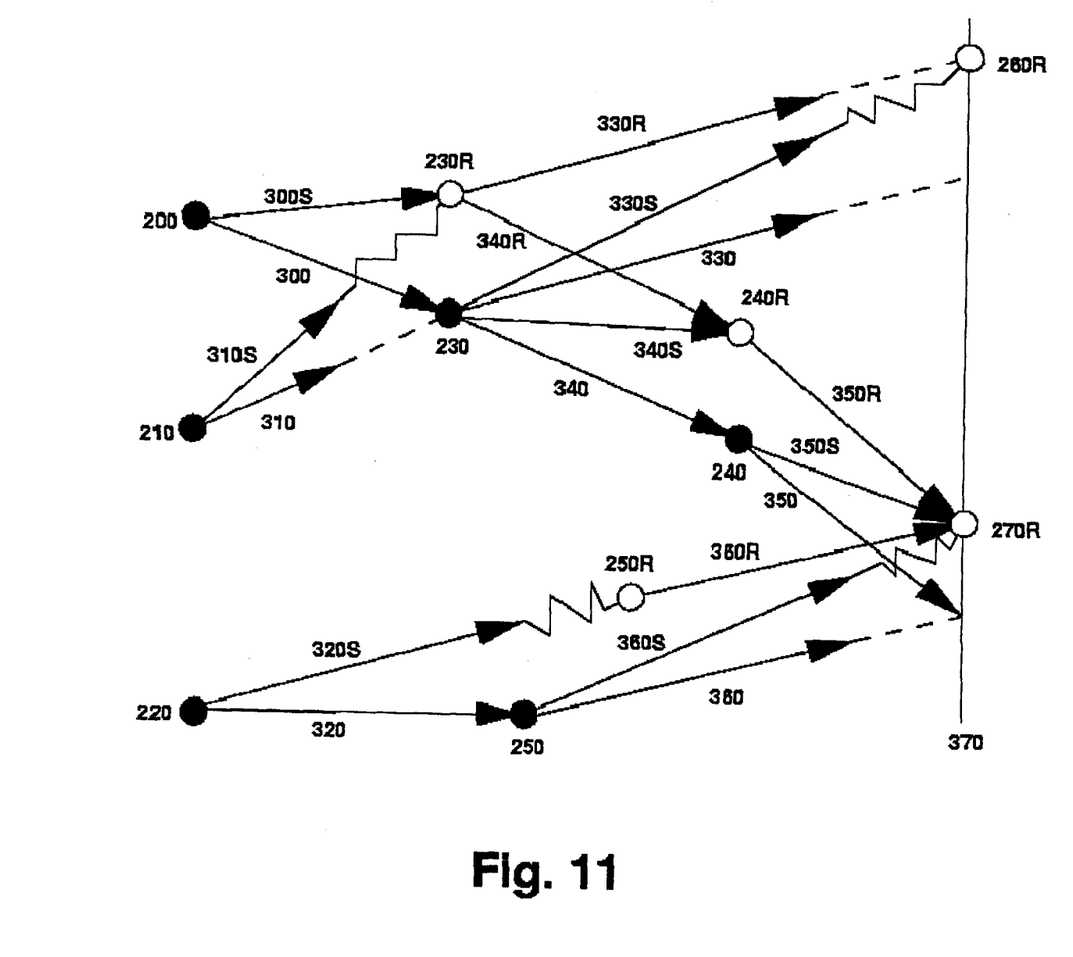
FIG. 11 is a diagram showing the introduction of a separation term for each edge in the timing graph of the design.

This is shown schematically in FIG. 11. Therein, and similar to the example of FIG. 9, the AT variables for nodes 260 and 270 have been pruned, with lines 300S, 310S, 320S, 330S, 340S, 350S, and 360S representing the separation terms. The zig-zag portions of these lines denote the positive separation values. Since edges 300, 340, and 350 lie on the critical path, their associated separations 300S, 340S, and 350S are zero and, therefore, they have no zig-zag portion. The dashed portions of edges 310, 330, 330R, and 360 illustrate the positive constraint slacks of the constraints involving those edges. In the present method, since each separation term is associated with a specific delay, the individual value for Ö in the separation function for each separation term can easier set according to the expected distribution of the associated delay (e.g., proportional to the standard deviation of the probability distribution function of the associated delay).

The preceding methods that employ RAT constraints provide the maximum control over the separation incentive applied to different portions of the timing graph, but require additional variables and constraints which can add to the runtime of the optimizer and can limit the problem size which it can handle. An alternative method uses only AT variables and constraints but is still able to remove all degeneracy from the optimization problem, by providing a separation term associated with each AT variable. The penalty function in this case is simply the sum of all the arrival time variables, weighted by some constant. The separation in this case is simply the negative of the distance of each AT value from zero or any other chosen constant.

Unlike previously described methods, the separation here is not bounded to be greater than zero, so the exponential separation function described above is not appropriate. In this case the downward pressure on each AT is equal and constant, so there is no special incentive to reduce delays on near-critical paths, as is the case for the other methods described, and the method is therefore likely to produce an optimized design which is more sensitive to unmodeled or unpredictable increases in delay than these methods. For the example of FIG. 7, the total penalty function using this method is:

$$P\text{total}=AT(230)+AT(240)+AT(250)+AT(260)+AT(270)$$

The embodiment described pertains to minimizing cycle time using a numerical optimizer. This method may, however, be applied to other optimization methods which seek to minimize a cost function, and to other design objectives which involve multiple constraints which must be simultaneously satisfied. Separation terms may be generated from early mode timing variables and functions, to increase the expected clock skew that the design can tolerate. Separation terms for late mode timing variables and functions can be generated even when the design cycle time is fixed and not to be minimized (e.g., when the objective is to minimize area or power consumption), in order to increase the probability that the design will operated at the desired cycle time. An optimization objective could be to minimize the supply voltage at which the design will function, where the supply voltage is a minimax variable which is constrained to be greater than or equal to the minimum operational supply voltage for each of the circuits in the design, and a separation term is added for each of these constraints.

Whereas the present invention has been described in terms of a preferred embodiment, it will be understood by those skilled in the art that numerous changes and modifications to the algorithm may be introduced without departing from the spirit of the invention, all of which fall within the scope of the appended claims.

What is claimed is:

1. A method for optimizing the design of a chip or system comprising the steps of:
    defining an objective function computed from parameters of the design;
    deriving a merit function from the objective function by adding to the objective function a plurality of separation terms; and
    minimizing the merit function which reduces the expected value of the objective function in the presence of variations of the design parameters.

2. The method as recited in claim 1, wherein the merit function is minimized by numerical optimization.

3. The method as recited in claim 1, wherein the merit function is minimized by simulated annealing.

4. The method as recited in claim 1, wherein the parameters of the design comprise transistor widths.

5. The method as recited in claim 1, wherein the objective function comprises the minimum cycle time at which the chip or system can operate.

6. The method as recited in claim 1, wherein at least one of the separation terms comprises a friction of a separation value computed from the parameters of the design.

7. The method as recited in claim 6, wherein the function is $$P(s)=Ke^{-s/\Phi},$$

wherein K and $\Phi$ are constants which are user dependent and s is the separation value.

8. The method as recited in claim 6, wherein at least one separation value is the difference between a minmax variable and one of the design functions of which the minmax variable is a maximum.

9. The method as recited in claim 6, wherein at least one of the separation values is a first timing slack at a first primary output of the design of the chip or system.

10. The method as recited in claim 9, wherein another of the at least one separation value is a second timing slack at a second primary output of the design of the chip or system.

11. The method as recited in claim 6, wherein at least one separation value is a first constraint slack of a first constraint of a primary output of the design of the chip or system.

12. The method as recited in claim 11, wherein another of the at least one separation value is a second constraint slack of a second constraint of a primary output of the design of the chip or system.

13. The method as recited in claim 6, wherein at least one separation value is the difference between a required arrival time at a first node of a timing graph of the design and an arrival time at the first node.

14. The method as recited in claim 13, wherein another of the at least one separation value is the difference between a required arrival time at a second node of the timing graph of the design and an arrival time at the second node.

15. The method as recited in claim 6, wherein at least one separation value is the difference between a required arrival time at a sink of a first arrival time constraint of the timing graph of the design and an arrival time at a source of the the first arrival time constraint.

16. The method as recited in claim 15, wherein another of the at least one separation value is the difference between a required arrival time at a sink of a second arrival time constraint of the timing graph of the design and an arrival time at a source of the second arrival time constraint.

17. The method as recited in claim 6, wherein at least one separation value is zero minus the arrival time at a node of the timing graph of the design.

18. A method for optimizing the design of a chip or system to minimize the expected cycle time at which the chip or system can operate, the method comprising the steps of:
    defining an objective function as the nominal value of the minimum cycle time at which the chip or system can operate computed as a function of the design parameters of the design;
    deriving a merit function from the objective function by adding to the objective function a plurality of separation terms, each of the separation terms being a function of the difference between two quantities associated with a node or edge of a timing graph of the design; and
    minimizing the merit function which reduces the expected value of the objective function in the presence of variations of the design parameters.

19. A method as recited in claim 18, wherein at least one of the separation terms is a function of a first slack at a primary output of the design, and another of the at least one separation term is a function of a second slack at a primary output of the design.

20. A program storage device readable by a machine, tangibly embodying a program of instructions executable by the machine to perform method steps for optimizing the design of a chip or system comprising:
    defining an objective function computed from parameters of the design of the chip or system;
    deriving a merit function from the objective function by adding to the objective function a plurality of separation terms; and
    minimizing the merit function which reduces the expected value of the objective function in the presence of variations of the design parameters.

* * * * *